United States Patent
Watanabe et al.

(10) Patent No.: US 10,006,116 B2
(45) Date of Patent: Jun. 26, 2018

(54) FORMING METHOD OF INTERMEDIATE LAYER FORMED BETWEEN BASE MATERIAL AND DLC FILM, DLC FILM FORMING METHOD, AND INTERMEDIATE LAYER FORMED BETWEEN BASE MATERIAL AND DLC FILM

(71) Applicant: Dowa Thermotech Co., Ltd., Tokyo (JP)

(72) Inventors: Motohiro Watanabe, Tokyo (JP); Hiroyuki Matsuoka, Tokyo (JP); Wataru Sakakibara, Tokyo (JP); Soichiro Nogami, Tokyo (JP)

(73) Assignee: DOWA THERMOTECH CO., LTD., Tokyo (JP)

( * ) Notice: Subject to any disclaimer, the term of this patent is extended or adjusted under 35 U.S.C. 154(b) by 49 days.

(21) Appl. No.: 15/034,835

(22) PCT Filed: Nov. 6, 2014

(86) PCT No.: PCT/JP2014/079495
§ 371 (c)(1),
(2) Date: May 5, 2016

(87) PCT Pub. No.: WO2015/068776
PCT Pub. Date: May 14, 2015

(65) Prior Publication Data
US 2016/0265099 A1    Sep. 15, 2016

(30) Foreign Application Priority Data
Nov. 6, 2013  (JP) .................................. 2013-230059

(51) Int. Cl.
C23C 14/22    (2006.01)
C23C 16/50    (2006.01)
(Continued)

(52) U.S. Cl.
CPC .......... *C23C 14/22* (2013.01); *C23C 14/0036* (2013.01); *C23C 14/024* (2013.01);
(Continued)

(58) Field of Classification Search
USPC ......... 204/192.1, 192.15; 428/212, 216, 336, 428/408, 469, 472, 698; 427/249, 577
See application file for complete search history.

(56) References Cited

U.S. PATENT DOCUMENTS 5,215,823 A * 6/1993 Itoh ..................... C23C 14/0605
428/472
6,033,533 A    3/2000 Sugiyama et al.
(Continued)

FOREIGN PATENT DOCUMENTS

CN    1402589 A    3/2003
CN    101082118 A    12/2007
(Continued)

OTHER PUBLICATIONS

Donnet et al "Diamond-like carbon-based functionally gradient coatings for space tribology" Surf & Coat Techn 120-121 (1999) p. 548-554.*
(Continued)

Primary Examiner — Archene Turner
(74) Attorney, Agent, or Firm — Michael Best & Friedrich LLP

(57) ABSTRACT

An intermediate layer forming method to form an intermediate layer formed between a base material and a DLC film using a PVD method includes: a Ti layer film-forming step of film-forming a Ti layer on a base material; and a TiC layer film-forming step of film-forming a TiC layer on the Ti layer, in which in the Ti layer film-forming step, an Ar gas is supplied into a chamber into which the base material is carried and a film-forming pressure is set to a pressure in a
(Continued)

range of not less than 0.4 Pa and not more than 1 Pa to film-form the Ti layer, and in the TiC layer film-forming step, an Ar gas and a $CH_4$ gas are supplied into the chamber, a film-forming pressure is set to a pressure in a range of 0.2 Pa or more to less than 0.4 Pa, and a second bias voltage higher in bias voltage than a first bias voltage applied to the base material in the Ti layer film-forming step and higher in bias voltage than −100 V is applied to the base material to film-form the TiC layer.

8 Claims, 2 Drawing Sheets

(51) Int. Cl.

| | | |
|---|---|---|
| C23C 14/00 | (2006.01) | |
| C23C 14/06 | (2006.01) | |
| C23C 14/16 | (2006.01) | |
| C23C 16/26 | (2006.01) | |
| C23C 14/02 | (2006.01) | |
| C23C 28/00 | (2006.01) | |

(52) U.S. Cl.
CPC ........ *C23C 14/027* (2013.01); *C23C 14/0635* (2013.01); *C23C 14/165* (2013.01); *C23C 16/26* (2013.01); *C23C 16/50* (2013.01); *C23C 28/322* (2013.01); *C23C 28/341* (2013.01); *C23C 28/343* (2013.01); *C03B 2215/30* (2013.01)

(56) References Cited

U.S. PATENT DOCUMENTS

| | | | | |
|---|---|---|---|---|
| 6,716,540 | B2* | 4/2004 | Kohara | C23C 14/025 428/408 |
| 7,927,700 | B2* | 4/2011 | Denul | C23C 16/0272 428/408 |
| 2009/0250338 | A1* | 10/2009 | Akari | C23C 14/024 204/192.15 |
| 2010/0247885 | A1* | 9/2010 | Ito | C23C 14/024 428/216 |
| 2011/0094628 | A1* | 4/2011 | Mitsuda | C23C 14/027 148/222 |

FOREIGN PATENT DOCUMENTS

| | | | |
|---|---|---|---|
| CN | 101597745 | A | 12/2009 |
| JP | H10-203896 | A | 8/1998 |
| JP | 2003-230411 | A | 8/2003 |
| JP | 2004-0688092 | * | 3/2004 |
| JP | 2004-137541 | A | 5/2004 |
| JP | 2006-052435 | A | 2/2006 |
| JP | 2008-025728 | * | 2/2008 |
| JP | 2011-225982 | * | 11/2011 |
| WO | WO-2005/014882 | A1 | 2/2005 |

OTHER PUBLICATIONS

International Search Report issued in Application No. PCT/JP2014/079495, dated Jan. 27, 2015.
A.A. Voebvodin et al., "Design of a Ti/TiC/DLC functionally gradient coating based on studies of structural transitions in Ti—C thin films", Thin Solid Films, Apr. 20, 1997, pp. 107-115, vol. 298, Issues 1-2, Elsevier Science S.A.
Office Action issued in Chinese Patent Application No. 201480060930.4, dated May 22, 2017.
Deng et al.: "DLC Multilayer Coatings for Wear Protection," Diamond and Related Materials, Elsevier Science Publishers, XP004066766, ISSN: 0925-9635, DOI: 10.1016/0925-9635(94)00256-8, vol. 4, No. 7, pp. 936-943, Aug. 1, 2005.
Wu et al.: "Characterization of Diamond-Like Carbon Coatings Prepared by Pulsed Bias Cathodic Vacuum Arc Deposition," Thin Solid Films, Elsevier Science Publishers, XP022349524, ISSN: 0040-6090, DOI: 10.1016/J.TSF.2007.06.134, vol. 516, No. 2-4, pp. 243-247, Nov. 17, 2007.
Wang et al.: "Influences of Optical Emission Settings on Wear Performance of Metal-Doped Diamond-Like Carbon Films Deposited by Unbalanced Magnetron Sputtering," Thin Solid Films, Elsevier Science Publishers, XP004246688, ISSN: 0040-6090, DOI: 10.1016/S0040-6090(01)00976-2, vol. 392, No. 1, pp. 11-15, Jul. 23, 2007.
Extended Search Report issued in European Patent Application No. 14859803.0, dated Jul. 31, 2017.

* cited by examiner

FORMING METHOD OF INTERMEDIATE LAYER FORMED BETWEEN BASE MATERIAL AND DLC FILM, DLC FILM FORMING METHOD, AND INTERMEDIATE LAYER FORMED BETWEEN BASE MATERIAL AND DLC FILM

CROSS-REFERENCE TO RELATED APPLICATION

This application is based upon and claims the benefit of priority of the prior Japanese Patent Application No. 2013-230059, filed on Nov. 6, 2013, the entire contents of which are incorporated herein by reference.

The present invention relates to a forming method of an intermediate layer formed between a base material and a DLC (diamond like carbon) film, a DLC film forming method using the forming method of the intermediate layer, and an intermediate layer formed between a base material and a DLC film.

BACKGROUND ART

In recent years, coating of a DLC film on a machine part has been performed with the aim of securing machine part hardness and improving abrasion resistance. Further, in order to improve a mold release property of a mold, coating of a DLC film on a mold has been also performed, and thus the DLC film has been used variously.

It has been generally known that when a DLC film is film-formed on the surface of a base material, the DLC film becomes likely to peel off because adhesiveness between the base material and the DLC film is bad. Therefore, forming an intermediate layer between the base material and the DLC film has been performed with the aim of improving the adhesiveness between the base material and the DLC film conventionally. For example, Patent Document 1 discloses a method of film-forming a Ti layer and a TiC layer as an intermediate layer. By providing the intermediate layer between the base material and the DLC film as above, the adhesiveness between the base material and the DLC film is increased.

PRIOR ART DOCUMENT

Patent Document

[Patent Document 1] Japanese Laid-open Patent Publication No. 10-203896

DISCLOSURE OF THE INVENTION

Problems to Be Solved by the Invention

In the meantime, manufacture of a DLC film with further improved adhesiveness has been desired in the market. For example, when the DLC film is applied to an automotive part, semipermanent adhesiveness is required. Further, when DLC coating is performed in order to improve a mold release property of a mold, an applicable usage environment can be expanded as the DLC film has adhesiveness capable of withstanding a higher contact pressure, so that an improvement in the adhesiveness is required.

Further, in the recent film-forming of the DLC film, a plasma CVD method in which a film-forming rate is fast is sometimes employed in terms of productivity, but due to characteristics of the manufacturing method, it is difficult to obtain high adhesiveness with respect to the intermediate layer formed by a conventional method. That is, the adhesiveness between the DLC film film-formed using the plasma CVD method and the intermediate layer formed by such a method as disclosed in Patent Document 1 becomes insufficient, and as a result, the adhesiveness between a base material and the DLC film also becomes insufficient. Therefore, an intermediate layer with further improved adhesiveness between a base material and a DLC film is needed.

The present invention has been made in consideration of the above-described circumstances, and an object thereof is to improve adhesiveness between a base material and a DLC film.

Means for Solving the Problems

The present invention that solves the above-described problems is an intermediate layer forming method to form an intermediate layer formed between a base material and a DLC film using a PVD method, the method including: a Ti layer film-forming step of film-forming a Ti layer on a base material; and a TiC layer film-forming step of film-forming a TiC layer on the Ti layer, in which in the Ti layer film-forming step, an Ar gas is supplied into a chamber into which the base material is carried and a film-forming pressure is set to a pressure in a range of not less than 0.4 Pa and not more than 1 Pa to film-form the Ti layer, and in the TiC layer film-forming step, an Ar gas and a $CH_4$ gas are supplied into the chamber, a film-forming pressure is set to a pressure in a range of 0.2 Pa or more to less than 0.4 Pa, and a second bias voltage higher in bias voltage than a first bias voltage applied to the base material in the Ti layer film-forming step and higher in bias voltage than $-100$ V is applied to the base material to film-form the TiC layer.

Further, as the present invention according to another aspect, there is provided a DLC film forming method to form a DLC film using a plasma CVD method on the intermediate layer formed by the above-described intermediate layer forming method.

Further, the present invention according to another aspect is an intermediate layer formed between a base material and a DLC film, the intermediate layer including: a Ti layer formed on a base material; and a TiC layer formed on the Ti layer, in which in an X-ray diffraction peak intensity ITiC (111) of the (111) crystal plane of TiC and an X-ray diffraction peak intensity IFe(110) of the (110) crystal plane of Fe found by measuring a surface of the base material by X-ray diffraction using a focusing method of the TiC layer, an intensity ratio expressed by ITiC(111)/IFe(110)×100 is 60 or more.

Effect of the Invention

According to the present invention, it is possible to improve adhesiveness between a base material and a DLC film. This makes it possible to further improve performance as the DLC film.

MODE FOR CARRYING OUT THE INVENTION

Figure 1:
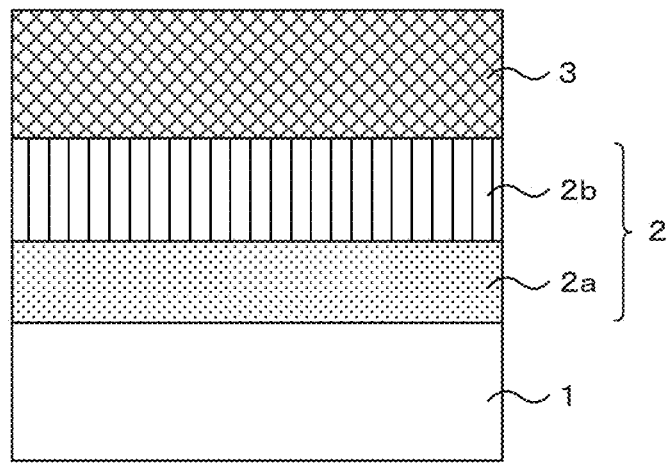
FIG. 1 is a schematic diagram illustrating a film structure on a base material related to an embodiment of the present invention.

Hereinafter, there will be explained an embodiment related to the present invention based on a method of forming an intermediate layer 2 (a Ti layer 2a and a TiC layer 2b) on the surface of a base material 1 and forming a DLC film 3 on the intermediate layer 2 as illustrated in FIG. 1. Incidentally, in this embodiment, the intermediate layer 2 is formed by what is called a UBMS (unbalanced magnetron sputter) method being one example of a PVD method, and the DLC film 3 is formed by a plasma CVD method. The UBMS (unbalanced magnetron sputter) method is a sputtering method in which plasma emission to a base material is strengthened by making a magnetic field of a sputter cathode unbalanced intentionally and enables formation of a dense thin film. Further, as an apparatus used for forming the intermediate layer 2 and the DLC film 3, a UBMS apparatus capable of performing plasma CVD in the same chamber as that in which the intermediate layer 2 is formed is used. The UBMS apparatus is one well-known generally, so that the explanation of the apparatus constitution is omitted in this description. Further, in this description and the drawings, the same reference numerals and symbols are added to components having substantially the same functional constitutions, and thereby redundant explanations are omitted.

First, as the base material 1, an iron-based material such as SCM415, SUS310, or SKD11 is carried into a chamber of the UBMS apparatus. Thereafter, the inside of the camber is vacuumed and the pressure is reduced to, for example, $2.6 \times 10^{-3}$ Pa or so. Subsequently, an Ar (argon) bombardment treatment is performed by heating a tungsten filament, and cleaning of the surface of the base material is performed. Incidentally, treatment conditions of the Ar bombardment treatment are that, for example, a chamber internal pressure is 1.3 to 1.4 Pa, a treatment time is 30 minutes, a filament discharge voltage is 40 V, a filament discharge current is 10 A, and a bias voltage is 300 to 400 V.

Next, a Ti layer film-forming step of film-forming the Ti layer 2a on the base material 1 is started. At first, as a plasma-generating gas, an Ar gas is supplied into the chamber. At this time, the Ar gas is supplied so that the chamber internal pressure (film-forming pressure) becomes a pressure in a range of not less than 0.4 Pa and not more than 1.0 Pa. Further, a flow rate of the Ar gas is adjusted so as to make the chamber internal pressure become constant during the Ti layer film-forming step. A chamber internal temperature is adjusted to be 200° C. or lower. This chamber internal temperature is maintained to 200° C. or lower until film-formation of the DLC film 3 to be described later is finished.

Thereafter, a pulse power supply for target is activated and a pulse power supply for bias is activated, to apply a bias voltage of −200 V, (which is a "first bias voltage" to be described later), to the base material 1. Thereby, the plasmatized Ar gas collides with a Ti target and Ti sputtered from the surface of the Ti target reaches the base material 1, and thereby the Ti layer 2a begins to be formed on the base material 1. Such film-forming processing of the Ti layer 2a is performed until a predetermined thickness (for example, 0.1 µm) of the Ti layer 2a is obtained. Unless the Ti layer 2a exists, adhesiveness between the TiC layer 2b to be described later and the base material cannot be obtained.

Incidentally, when the bias voltage in the Ti layer film-forming step is lower than −500 V, there is a risk that the base material 1 is damaged. On the other hand, when the bias voltage in the Ti layer film-forming step is higher than −100 V, energy of Ti to reach the base material 1 is small and a film does not become dense but becomes too smooth, therefore causing a risk that adhesiveness cannot be obtained. Therefore, the bias voltage in the Ti layer film-forming step is preferably −500 to −100 V. It is more preferably −400 to −200 V and further preferably −300 to −200 V. Incidentally, in this description, when levels of negative bias voltages are expressed, a bias voltage closer to 0 V is expressed to be "high in bias voltage."

Next, a TiC layer film-forming step of film-forming the TiC layer 2b on the Ti layer 2a is started. First, a $CH_4$ (methane) gas is further supplied into the chamber into which the Ar gas has been supplied. At this time, the $CH_4$ gas is supplied so that a flow rate ratio between the Ar gas and the $CH_4$ gas becomes about 95:5 constantly. Further, flow rates of the individual gases are adjusted so that the chamber internal pressure (film-forming pressure) becomes a pressure in a range of 0.2 Pa or more to less than 0.4 Pa. The chamber internal pressure is adjusted to be constant during the TiC layer film-forming step. Further, the bias voltage to be applied to the base material 1 is changed to −50 V from −200 V.

The above-described film-forming conditions are applied, and thereby the TiC layer 2b begins to be formed on the Ti layer 2a. Such film-forming processing of the TiC layer 2b is performed until a predetermined film thickness (for example, 0.45 µm) of the TiC layer 2b is obtained.

Incidentally, when the bias voltage in the TiC layer film-forming step, (which is a "second bias voltage" to be described later), is −100 V or lower, the TiC layer 2b to be formed becomes too smooth, thereby making it impossible to secure the adhesiveness sufficiently. Therefore, the bias voltage in the TiC layer film-forming step needs to be higher than −100 V. On the other hand, when the bias voltage in the TiC layer film-forming step becomes −30 V or higher, mixture of Ti and carbon does not advance, to thus cause a risk that hardness decreases. Therefore, the bias voltage in the TiC layer film-forming step is preferably set to be higher than −100 V and lower than −30 V. It is further preferably −75 to −50 V.

By the Ti layer film-forming step and the TiC layer film-forming step described above, the intermediate layer 2 is formed on the surface of the base material 1.

Thereafter, as a gas for film-forming the DLC film 3, a $C_2H_2$ (acetylene) gas is supplied into the same chamber as that in which the above-described intermediate layer 2 is formed. Then, the DLC film 3 is film-formed on the TiC layer 2b of the intermediate layer 2 by a conventionally well-known plasma CVD method.

By undergoing the above-described series of steps, the intermediate layer 2 (the Ti layer 2a and the TiC layer 2b) and the DLC film 3 are formed on the base material. When the film-forming pressure of the TiC layer 2b is set to be lower than that of the Ti layer 2a and the bias voltage in the film-forming step of the TiC layer 2b (second bias voltage) is set to be higher than that in the film-forming step of the Ti layer 2a (first bias voltage) as described in this embodiment, the adhesiveness between the base material 1 and the DLC film 3 can be improved as will be described in Examples to be described later. This makes it difficult for the DLC film 3 to peel off, to thus be able to improve performance as the DLC film 3

In the foregoing, the preferred embodiment of the present invention has been described, but the present invention is not limited to such an example. It is apparent that those skilled in the art are able to devise various variation or modification examples within the scope of the technical spirit described in the claims, and it should be understood that such examples belong to the technical scope of the present invention as a matter of course.

For example, in the above-described embodiment, as the plasma-generating gas, the Ar gas is used, but the plasma-generating gas is not limited to this. Further, the formation of the intermediate layer 2 is not limited to using the Ti target. Further, the gases to be supplied into the chamber are not also limited to the $CH_4$ gas and the $C_2H_2$ gas.

Formation of Graded Layer 2c

Figure 2:
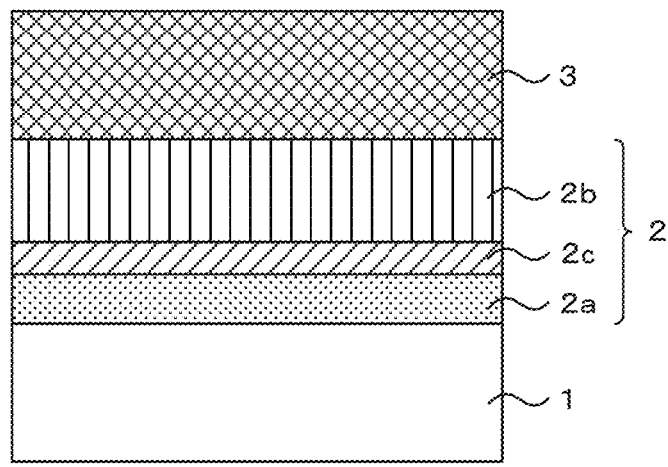
FIG. 2 is a schematic diagram illustrating a film structure on a base material related to another embodiment of the present invention.

Further, the above-described embodiment is designed that the Ti layer 2a and the TiC layer 2b are film-formed as the intermediate layer 2, but as illustrated in FIG. 2, a graded layer 2c may also be film-formed between the Ti layer 2a and the TiC layer 2b. The graded layer 2c means a layer rich in Ti on the Ti layer 2a side and having a large content of C on the TiC layer 2b side as compared to the Ti layer 2a side. As will be explained in Examples to be described later, the graded layer 2c is provided, thereby making it possible to improve the adhesiveness between the base material 1 and the DLC film 3.

Here, there will be explained a film-forming step of the graded layer 2c. First, the Ti layer 2a is film-formed on the base material 1 by the Ti layer film-forming step explained in the above-described embodiment. Thereafter, a $CH_4$ gas is supplied into the chamber into which the Ar gas has been supplied. A flow rate is a volume basis such as $m^3$ (1000 L)/minute. At this time, the flow rate of the $CH_4$ gas is increased gradually so that a flow rate ratio between the Ar gas and the $CH_4$ gas changes gradually from 100:0 to 95:5. Further, the bias voltage to be applied to the base material 1 is gradually increased from −200 V in the Ti layer film-forming step to −50 V in the TiC layer film-forming step according to the flow rate. Incidentally, the flow rate ratio between the Ar gas and the $CH_4$ gas and the bias voltage are adjusted to change continuously until the graded layer film-forming step is finished. For example, when a processing time in the graded layer film-forming step is 10 minutes, it is designed so that the flow rate ratio between the Ar gas and the $CH_4$ gas is changed continuously for 10 minutes and the flow rate ratio becomes 95:5 when 10 minutes elapse. The same is applied also to the bias voltage.

Thereby, the graded layer 2c whose composition has been changed continuously is formed on the Ti layer 2a. Incidentally, the film-forming pressure in the graded layer film-forming step is set to the same as the pressure in the Ti layer film-forming step, or set to a pressure lower than the film-forming pressure in the Ti layer film-forming step and higher than the film-forming pressure of the TiC layer. Further, even in the case when the bias voltage is set to be constant and the flow rate of the $CH_4$ gas is increased gradually, the graded layer 2c can be formed.

Thereafter, the graded layer 2c is formed so as to have a predetermined film thickness (for example, 0.05 μm), and then the TiC layer 2b is film-formed on the graded layer 2c by the TiC layer film-forming step explained in the above-described embodiment. Then, by the plasma CVD method, the DLC film 3 is film-formed on the TiC layer 2b.

Example

Under conditions illustrated in Table 1 below, intermediate layers were each formed on a base material by the UBMS method, and DLC films were film-formed on the individual intermediate layers by the plasma CVD method. Then, differences in adhesiveness among the DLC films at this time were evaluated. Evaluation results of the DLC films are illustrated also in Table 1.

In this example, as the base material, one in which a SCM415 was subjected to a carburizing and quenching treatment and was subjected to a tempering treatment at 200° C. to be polished to a surface roughness of Ra=0.01 μm was used. Further, in order to suppress a decrease in hardness of the base material, the chamber internal temperature was adjusted to be 200° C. or lower from start of the Ti layer film-forming step until finish of the DLC film-forming step. Further, the number of targets was set to one and an output of the pulse power supply for target was set to 6 kW. Further, a distance between the base material and the Ti target was set to about 15 cm, a base material rotation number was set to a self-revolving motion at 2 rpm, a frequency was set to 25 kHz, and a Duty ratio was set to 75%. Incidentally, "FILM-FORMING PRESSURE" in Table 1 means the chamber internal pressure during film-forming processing.

Further, in this example, a Ti layer and a TiC layer were designed to be film-formed as the intermediate layer. Incidentally, in Examples 3 to 8 and Comparative examples 1 to 4, a graded layer was also further film-formed. As for each film-forming time of the individual layers, it is 15 minutes in the Ti layer, it is 7.5 minutes in the graded layer, and it is 105 minutes in the TiC layer. Further, the DLC film was film-formed so as to have a film thickness of 1.8 μm, and a film hardness was adjusted to be about HV 1600 using a microhardness tester (FISCHERSCOPE H100C manufactured by Fischer Instruments).

Further, as for the adhesiveness evaluation of the DLC film, a scratch test and an indentation observation by a Rockwell hardness tester were performed, and comparisons were performed with individual samples.

The scratch test was performed on the surface of the sample with a scratch length of 10 mm, at a scratch speed of 10 mm/min, and with a scratch load of 0 to 100 N using a Rockwell C-scale indenter (in conformity with JIS Z 2245: diamond with a pointed end of 0.2 mm in radius of curvature and with a cone angle of 120°, and after scratch, the load with which peeling occurred was recorded by observation of an attached microscope. In this example, in terms of usefulness, ones with a peeling occurrence load being 35 N or more are set to be accepted.

Further, the indentation by the Rockwell hardness tester was formed by applying an initial test force of 98.07 N and a total test force of 1471 N onto the surface of the sample by the above-described Rockwell C-scale indenter. Then, whether or not peeling of the DLC film exists in an indentation peripheral portion was observed. In this example, ones without peeling of the DLC film are set to be accepted.

That is, in this example, as long as the peeling occurrence load of the DLC film is 35 N or more in the scratch test and the state where peeling of the DLC film does not exist in the indentation peripheral portion is found in a Rockwell hardness test, the adhesiveness between the base material and the DLC film is determined to be improved.

TABLE 1

| | INTERMEDIATE LAYER | | | | | | | |
|---|---|---|---|---|---|---|---|---|
| | Ti LAYER | | | | GRADED LAYER | | | |
| | | | | | FILM- | | | |
| | BIAS VOLTAGE (V) | FILM-FORMING PRESSURE (Pa) | FLOW RATE RATIO AR:CH$_4$ | FILM THICKNESS (μM) | BIAS VOLTAGE (V) | FORMING PRESSURE (Pa) | FLOW RATE RATIO AR:CH$_4$ | FILM THICKNESS (μM) |
| EXAMPLE 1 | −200 | 0.4 | 100:0 | 0.15 | — | — | — | — |
| EXAMPLE 2 | −200 | 0.4 | 100:0 | 0.1 | — | — | — | — |
| EXAMPLE 3 | −200 | 0.4 | 100:0 | 0.1 | −200 → −50 | 0.4 | 100:0 → 95:5 | 0.05 |
| EXAMPLE 4 | −200 | 1 | 100:0 | 0.1 | −200 → −50 | 0.4 | 100:0 → 95:5 | 0.05 |
| EXAMPLE 5 | −200 | 0.4 | 100:0 | 0.1 | −200 → −75 | 0.4 | 100:0 → 95:5 | 0.05 |
| EXAMPLE 6 | −300 | 0.4 | 100:0 | 0.1 | −300 → −50 | 0.4 | 100:0 → 95:5 | 0.05 |
| EXAMPLE 7 | −400 | 0.4 | 100:0 | 0.1 | −400 → −50 | 0.4 | 100:0 → 95:5 | 0.05 |
| EXAMPLE 8 | −200 | 0.4 | 100:0 | 0.2 | −200 → −75 | 0.4 | 100:0 → 95:5 | 0.05 |
| COMPARATIVE EXAMPLE 1 | −200 | 0.4 | 100:0 | 0.1 | −200 → −50 | 0.4 | 100:0 → 95:5 | 0.05 |
| COMPARATIVE EXAMPLE 2 | −100 | 0.2 | 100:0 | 0.1 | −100 | 0.2 | 100:0 → 95:5 | 0.05 |
| COMPARATIVE EXAMPLE 3 | −200 | 1 | 100:0 | 0.1 | −200 → −50 | 1 | 100:0 → 95:5 | 0.05 |
| COMPARATIVE EXAMPLE 4 | −200 | 0.4 | 100:0 | 0.1 | −200 → −100 | 0.4 | 100:0 → 90:10 | 0.05 |

| | INTERMEDIATE LAYER | | | | ADHESIVENESS EVALUATION OF DLC FILM | |
|---|---|---|---|---|---|---|
| | TiC LAYER | | | INTERMED- | PEELING | |
| | BIAS VOLTAGE (V) | FILM-FORMING PRESSURE (Pa) | FLOW RATE RATIO AR:CH$_4$ | FILM THICKNESS (μM) | IATE LAYER FILM THICKNESS (uM) | OCCURRENCE LOAD OF SCRATCH TEST (N) | PEELING OF INDENTATION PERIPHERAL PORTION AFTER ROCKWELL HARDNESS TEST |
| EXAMPLE 1 | −50 | 0.2 | 95:5 | 0.45 | 0.6 | 44 | NONE |
| EXAMPLE 2 | −50 | 0.2 | 95:5 | 0.5 | 0.6 | 50 | NONE |
| EXAMPLE 3 | −50 | 0.2 | 95:5 | 0.45 | 0.6 | 61 | NONE |
| EXAMPLE 4 | −50 | 0.2 | 95:5 | 0.45 | 0.6 | 37 | NONE |
| EXAMPLE 5 | −75 | 0.2 | 95:5 | 0.45 | 0.6 | 43 | NONE |
| EXAMPLE 6 | −50 | 0.2 | 95:5 | 0.45 | 0.6 | 44 | NONE |
| EXAMPLE 7 | −50 | 0.2 | 95:5 | 0.45 | 0.6 | 39 | NONE |
| EXAMPLE 8 | −75 | 0.2 | 95:5 | 0.4 | 0.6 | 47 | NONE |
| COMPARATIVE EXAMPLE 1 | −50 | 0.4 | 95:5 | 0.35 | 0.5 | 33 | EXISTENCE |
| COMPARATIVE EXAMPLE 2 | −100 | 0.2 | 95:5 | 0.45 | 0.6 | 27 | EXISTENCE |
| COMPARATIVE EXAMPLE 3 | −50 | 1 | 95:5 | 0.45 | 0.6 | 30 | EXISTENCE |
| COMPARATIVE EXAMPLE 4 | −100 | 0.2 | 90:10 | 0.45 | 0.6 | 32 | EXISTENCE |

As Examples 1 to 8 in Table 1, when the intermediate layer was formed in a manner to make the film-forming pressure of the TiC layer lower than that of the Ti layer, results of the scratch test and the Rockwell hardness test both reached the acceptance criterion.

Figure 3:
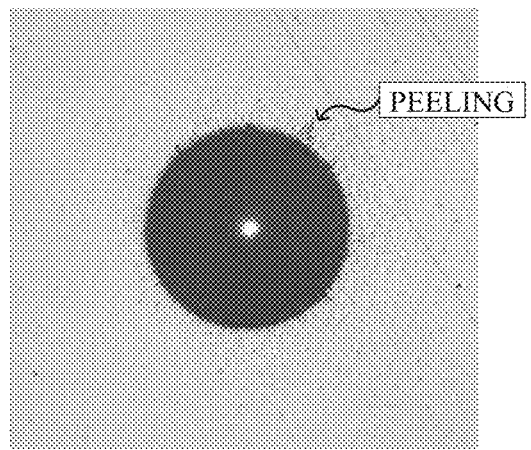
FIG. 3 is a view illustrating an indentation peripheral portion after a Rockwell hardness test related to Comparative example 1.
Figure 4:
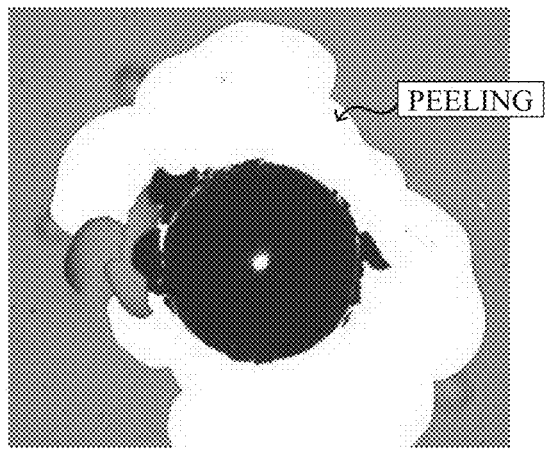
FIG. 4 is a view illustrating an indentation peripheral portion after a Rockwell hardness test related to Comparative example 2.
Figure 5:
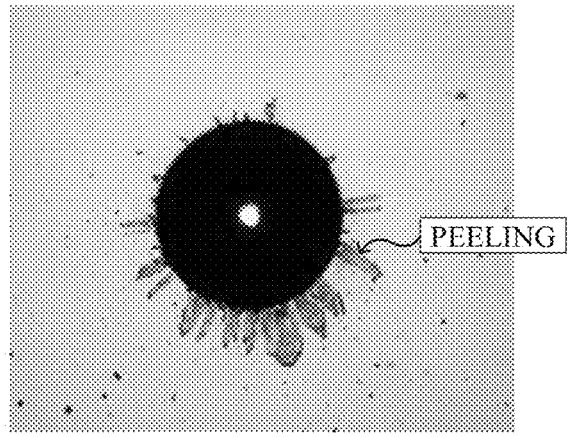
FIG. 5 is a view illustrating an indentation peripheral portion after a Rockwell hardness test related to Comparative example 3.

As Comparative examples 1 to 3, on the other hand, when the film-forming pressure of the intermediate layer was set to be always constant, the result of the scratch test fell below the acceptance criterion (the peeling occurrence load of 35 N or more). Further, in the indentation peripheral portion after the Rockwell hardness test, peeling of the DLC film occurs as illustrated in FIG. 3 (Comparative example 1), FIG. 4 (Comparative example 2), and FIG. 5 (Comparative example 3), to thereby find that the adhesiveness of the DLC film is not good.

Next, when focusing on the film-forming conditions of Examples 1 to 3, the film-forming pressure of the Ti layer is 0.4 Pa and the film-forming pressure of the TiC layer is 0.2 Pa, resulting in that the conditions of the film-forming pressures are the same. However, the peeling occurrence load of the scratch test in Example 3 having the graded layer became larger than that in Examples 1 and 2 each having no graded layer as a result. That is, it is found that when the graded layer is film-formed as the intermediate layer, the effect of improving the adhesiveness of the DLC film is increased.

Further, even though Comparative example 1 had the graded layer capable of improving the adhesiveness of the DLC film, the evaluation result of the DLC film resulted in rejection. On the other hand, the evaluation result of the DLC film in Examples 1 and 2 each having no graded layer is good. That is, making a comparison between Examples 1 and 2 and Comparative example 1 supports that it is better when the film-forming pressures of the Ti layer and the TiC layer are not constant.

Next, when focusing on the film-forming conditions of Example 3 and Example 4, Examples 3 and 4 both have the graded layer, but differ only in the film-forming pressure of the Ti layer because they are 0.4 Pa and 1 Pa. Making a comparison between the evaluation result of the DLC film in Example 3 and the evaluation result of the DLC film in Example 4 revealed that the peeling occurrence load in the scratch test becomes larger in Example 3 as a result. Therefore, the film-forming pressure of the Ti layer is found to be preferable when it is lower.

Besides, in consideration of the fact that only the film-forming pressure of the Ti layer is different between Example 3 and Example 4 in terms of the film-forming condition and the evaluation result of the DLC film reached the acceptance criterion both in Example 3 and Example 4, it is obvious that even when the film-forming pressure of the Ti layer is, for example, 0.7 Pa being a pressure higher than 0.4 Pa in Example 3 and lower than 1 Pa in Example 4, the evaluation result of the DLC film becomes good.

Further, the film-forming pressures of the Ti layer and the TiC layer in Comparative example 1 are 0.4 Pa constantly, and under this condition, the evaluation result of the DLC film results in rejection. On the other hand, in Example 3, the film-forming pressure of the Ti layer is 0.4 Pa and the film-forming pressure of the TiC layer is 0.2 Pa, resulting in that the film-forming pressure of the TiC layer becomes smaller than that of the Ti layer. In consideration of the fact that the evaluation result of the DLC film results in acceptance under this condition, it is found that the film-forming pressures of the Ti layer and the TiC layer are not constant and it is better when the film-forming pressure of the TiC layer is a little lower than that of the Ti layer.

Accordingly, when considering the results of Examples 3 and 4 and Comparative example 1, it is conceivable that as long as the film-forming pressure of the Ti layer is set to a pressure in a range of not less than 0.4 Pa and not more than 1 Pa and the film-forming pressure of the TiC layer is set to a pressure in a range of 0.2 Pa or more to less than 0.4 Pa, the adhesiveness of the DLC film can be improved.

However, in Comparative example 4, even though the film-forming pressure of the TiC layer was lower than that of the Ti layer, the adhesiveness evaluation of the DLC film fell below the acceptance criterion. On the other hand, in Examples 3 and 5 in which the graded layer is provided similarly to Comparative example 4 and the film-forming pressures and the film thicknesses of the individual layers are also the same, the evaluation result of the DLC film reaches the acceptance criterion. Here, when focusing on the bias voltages of Examples 3 and 5 and Comparative example 4, the bias voltages in the TiC layer film-forming step are different from one another. That is, the reason why the adhesiveness of the DLC film in Comparative example 4 became bad is conceivably because the bias voltage in the TiC layer film-forming step was −100 V, and thereby the formed TiC layer became too smooth and the adhesiveness became insufficient.

Accordingly, in order to improve the adhesiveness of the DLC film, it is necessary to set the film-forming pressure of the Ti layer to a pressure in a range of not less than 0.4 Pa and not more than 1 Pa and set the film-forming pressure of the TiC layer to a pressure in a range of 0.2 Pa or more to less than 0.4 Pa, and further make the bias voltage in the TiC layer film-forming step become higher than −100 V.

Next, in a state where the TiC layers were formed under the conditions of Examples, 3, 5, 6, and 8 and Comparative examples 1, 3, and 4, X-ray diffraction was performed on the individual surfaces of the base materials by a focusing method using an X-ray diffractometer (RINT2000 manufactured by Rigaku Corporation). As an X-ray tube, a Cu tube was used, a voltage was set to 40 kV, a current was set to 20 mA, a scan angle 2θ was set to 20 to 80°, and a scan step was set to 3°/min. In an X-ray diffraction peak intensity ITiC (111) of the (111) crystal plane of TiC appearing near 2θ:36.3 degrees and an X-ray diffraction peak intensity IFe(110) of the (111) crystal plane of Fe appearing near 2θ:44.6 degrees, which were measured in an X-ray diffraction (XRD) profile at this time, an intensity ratio expressed by ITiC(111)/IFe(110) was calculated. Results are illustrated in Table 2.

TABLE 2

|  | TiC INTENSITY ITiC (111) | Fe INTENSITY IFe (110) | TiC/Fe INTENSITY RATIO (Fe IS SET TO 100) ITiC (111)/ IFe (110) × 100 |
| --- | --- | --- | --- |
| EXAMPLE 1 | — | — | — |
| EXAMPLE 2 | — | — | — |
| EXAMPLE 3 | 506 | 461 | 109 |
| EXAMPLE 4 | — | — | — |
| EXAMPLE 5 | 450 | 439 | 102 |
| EXAMPLE 6 | 582 | 537 | 108 |
| EXAMPLE 7 | — | — | — |
| EXAMPLE 8 | 836 | 496 | 168 |
| COMPARATIVE EXAMPLE 1 | 129 | 529 | 24 |
| COMPARATIVE EXAMPLE 2 | — | — | — |
| COMPARATIVE EXAMPLE 3 | 62 | 351 | 17 |
| COMPARATIVE EXAMPLE 4 | 249 | 429 | 58 |

As illustrated in Table 2, in Comparative examples 1, 3, and 4, ITiC(111) was smaller than IFe(110) and the intensity ratio between TiC and Fe was about 58 at the maximum. On the other hand, in Examples 3, 5, 6, and 8, ITiC(111) was large as compared to that in Comparative examples 1, 3, and 4, and the intensity ratio between TiC and Fe exceeded 100 in all of Examples 3, 5, 6, and 8.

When considering the adhesiveness evaluation results of the DLC film illustrated in Table 1 and the results of the XRD measurement illustrated in Table 2, it is found that what is necessary is to form such an intermediate layer that the intensity ratio expressed by ITiC(111)/IFe(110)×100 becomes 60 or more in order to improve the adhesiveness of the DLC film. Further, the more preferable intensity ratio is 80 or more, and the still more preferable intensity ratio is 100 or more.

INDUSTRIAL APPLICABILITY

The present invention can be applied to DLC film coating of a base material.

EXPLANATION OF CODES 1 base material
2 intermediate layer
2a Ti layer
2b TiC layer
2c graded layer
3 DLC film

The invention claimed is:
1. An intermediate layer forming method to form an intermediate layer formed between a base material and a DLC film using a PVD method, the method comprising:
a Ti layer film-forming step of film-forming a Ti layer on a base material; and
a TiC layer film-forming step of film-forming a TiC layer on the Ti layer, wherein in the Ti layer film-forming step, an Ar gas is supplied into a chamber into which the base material is carried and a film-forming pressure is set to a pressure in a range of not less than 0.4 Pa nor more than 1 Pa to film-form the Ti layer, in the TiC layer film-forming step, an Ar gas and a $CH_4$ gas are supplied into the chamber, a film-forming pressure is set to a pressure in a range of 0.2 Pa or more to less than 0.4 Pa, and a second bias voltage higher in bias voltage than a first bias voltage applied to the base material in the Ti layer film-forming step and higher in bias voltage than −100 V is applied to the base material to film-form the TiC layer, and the PVD method is an unbalanced magnetron sputter method.

2. The intermediate layer forming method according to claim 1, further comprising:

between the Ti layer film-forming step and the TiC layer film-forming step, a graded layer film-forming step of film-forming a graded layer on the Ti layer, wherein in the graded layer film-forming step, an Ar gas and a $CH_4$ gas are supplied into the chamber, the graded layer is film-formed while increasing a flow rate of the $CH_4$ gas until a flow rate ratio between the Ar gas and the $CH_4$ gas becomes a flow rate ratio between the Ar gas and the $CH_4$ gas in the TiC layer film-forming step, and in the TiC layer film-forming step, the TiC layer is film-formed on the graded layer.

3. The intermediate layer forming method according to claim 2, wherein in the graded layer film-forming step, a bias voltage to be applied to the base material is changed from the first bias voltage to the second bias voltage.

4. The intermediate layer forming method according to claim 1, wherein in the Ti layer film-forming step, the Ti layer is film-formed so that a film thickness becomes 0.1 to 0.2 μm.

5. The intermediate layer forming method according to claim 1, wherein in the TiC layer film-forming step, the TiC layer is film-formed so that a film thickness becomes 0.4 to 0.5 μm.

6. The intermediate layer forming method according to claim 1, wherein in the Ti layer film-forming step, the first bias voltage is set to a voltage in a range of −500 V to −100 V to film-form the Ti layer.

7. The intermediate layer forming method according to claim 1, wherein in the TiC layer film-forming step, the second bias voltage is set to a voltage in a range of higher than −100 V and lower than −30 V to film-form the TiC layer.

8. A DLC film forming method to form a DLC film using a plasma CVD method on the intermediate layer formed by the intermediate layer forming method according to claim 1.

* * * * *